United States Patent
Kooli et al.

(10) Patent No.: US 11,482,264 B2
(45) Date of Patent: Oct. 25, 2022

(54) MEMORY MODULE ADAPTED TO IMPLEMENTING COMPUTING FUNCTIONS

(71) Applicant: Commissariat à l'Energie Atomique et aux Energies Alternatives, Paris (FR)

(72) Inventors: Maha Kooli, Grenoble (FR); Roman Gauchi, Grenoble (FR); Pascal Vivet, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 17/645,527

(22) Filed: Dec. 22, 2021

(65) Prior Publication Data

US 2022/0208238 A1    Jun. 30, 2022

(30) Foreign Application Priority Data

Dec. 28, 2020 (FR) ..................................... 2014174

(51) Int. Cl.
*G11C 7/10* (2006.01)
*G06F 13/16* (2006.01)

(52) U.S. Cl.
CPC ........ *G11C 7/1096* (2013.01); *G06F 13/1605* (2013.01); *G06F 13/1668* (2013.01);
(Continued)

(58) Field of Classification Search
CPC ... G11C 7/1096; G11C 7/1039; G11C 7/1063; G11C 7/1069; G11C 7/109;
(Continued)

(56) References Cited

U.S. PATENT DOCUMENTS 6,654,835 B1 * 11/2003 Foster .................... H04N 5/775
 709/200
9,465,727 B2 * 10/2016 Takashima .......... G06F 13/1678
(Continued)

FOREIGN PATENT DOCUMENTS

EP    2320325 A1    5/2011
EP    2476061 B1    7/2013
(Continued)

OTHER PUBLICATIONS

Preliminary Search Report for French Application No. 2014174 dated Sep. 17, 2021, 2 pages.
(Continued)

*Primary Examiner* — Fernando Hidalgo
(74) *Attorney, Agent, or Firm* — Moreno IP Law LLC

(57) ABSTRACT

The present description concerns a memory device (200) comprising: a memory circuit (201) implementing operations and performing elementary operations including a reading, a writing, or a computing operation; a control circuit (205) receiving instructions from a processor (231), and breaking down each received instruction into a plurality of elementary operations to generate an elementary operation request flow; a circuit (203) of direct data transfer from or to said memory circuit (201), the transfer circuit (203) receiving instructions from the processor (231), breaking down each received instruction into a plurality of elementary operations to be performed in said memory circuit to generate an elementary operation request flow; an internal data exchange link (204) directly coupling said memory circuit (201) to the direct transfer circuit (203); and an arbitration circuit (309).

13 Claims, 3 Drawing Sheets

(52) U.S. Cl.
CPC ............ *G11C 7/109* (2013.01); *G11C 7/1039* (2013.01); *G11C 7/1063* (2013.01); *G11C 7/1069* (2013.01)

(58) Field of Classification Search
CPC . G11C 7/1075; G11C 7/1006; G06F 13/1605; G06F 13/1668
USPC .................................................. 365/189.011
See application file for complete search history.

(56) References Cited

U.S. PATENT DOCUMENTS

| | | | |
|---|---|---|---|
| 10,483,978 | B1 | 11/2019 | Finkbeiner et al. |
| 2004/0028053 | A1* | 2/2004 | Mes .................... H04L 12/5601 710/308 |
| 2006/0090017 | A1 | 4/2006 | Kim et al. |
| 2011/0093665 | A1 | 4/2011 | Walker et al. |
| 2021/0117334 | A1* | 4/2021 | Guim Bernat ...... G06F 12/0882 |
| 2021/0191805 | A1* | 6/2021 | Brandon ............. G06F 11/3062 |
| 2021/0263866 | A1* | 8/2021 | Norman .............. G06F 13/1668 |
| 2021/0294494 | A1* | 9/2021 | Kachare .................. G06F 9/541 |
| 2021/0294738 | A1* | 9/2021 | Tadokoro ............ G06F 12/0246 |
| 2021/0357337 | A1* | 11/2021 | Geerlings ........... G06F 12/0238 |
| 2022/0075560 | A1* | 3/2022 | Segev .................. G06F 3/0656 |
| 2022/0129201 | A1* | 4/2022 | Bamdhamravuri ......... G06F 13/1673 |
| 2022/0188116 | A1* | 6/2022 | Sherwood ................ G06F 7/57 |

FOREIGN PATENT DOCUMENTS

| | | |
|---|---|---|
| EP | 3252774 A1 | 12/2017 |
| EP | 3503103 A1 | 12/2018 |
| FR | 3070514 A1 | 3/2019 |
| FR | 3113332 A1 | 2/2022 |

OTHER PUBLICATIONS

R. Gauchi et al., "Reconfigurable Tiles of Computing-In-Memory SRAM Architecture for Scalable Vectorization," Proceedings of the ACM/IEEE International Symposium on Low Power Electronics and Design (ISLPED '20), Aug. 2020, 6 pages.

* cited by examiner

MEMORY MODULE ADAPTED TO IMPLEMENTING COMPUTING FUNCTIONS

FIELD

The present disclosure generally concerns the field of memory circuits, and more particularly aims at the field of memory circuits adapted to implementing computing operations.

BACKGROUND

Memory circuits adapted to implementing computing operations, or smart memory circuits, have already been provided. Such circuits are for example intended to cooperate with a processor, to relieve the processor of certain computing tasks.

However, the data used for the computing operations requested by a processor from such a smart memory circuit are unfortunately not always present in the smart memory. Further, even if they are present in the memory, they are not necessarily stored in a desired space in the memory or according to an ideal storage order, which may require operations of data manipulation in the memory by read/write operations orchestrated by the processor. Thus, it is desirable to find solutions to further relieve the use of the processor and generally the data exchange channels used by the processor.

SUMMARY

For this purpose, an embodiment provides a memory device comprising:
 a port of connection of the device to a processor;
 a memory circuit adapted to implementing computing operations and to carrying out elementary operations including a reading, a writing, or a computing operation;
 a first control circuit adapted to receiving first instructions from the processor via said port, and of breaking down each first received instruction into a sequence of one or a plurality of elementary operations to generate a first elementary operation request flow;
 a circuit of direct data transfer from or to said memory circuit, the direct transfer circuit being adapted to receiving second instructions from the processor via said port, of breaking down each second received instruction into a sequence of a plurality of elementary operations to be performed in said memory circuit to generate a second elementary operation request flow;
 an internal data exchange link directly coupling said memory circuit to the direct transfer circuit; and
 an arbitration circuit adapted to receiving the first and second elementary operation request flows and of controlling the first control circuit to execute a single general elementary operation request flow in the memory circuit by implementing predefined priority rules in the case of simultaneous requests for access to the memory circuit,
wherein the internal link has a data width greater than the data width of the port of connection of the device to the processor.

According to an embodiment, the direct transfer circuit comprises a buffer circuit adapted to temporarily storing data transiting from or to the memory circuit.

According to an embodiment, the device comprises a distribution circuit connected to said port of connection of the device to the processor, the distribution circuit receiving the first and second instructions from the processor and being adapted to transmitting the first instructions to the first control circuit and the second instructions to the direct transfer circuit, the distribution circuit using address information present in the instruction to perform this distribution.

According to an embodiment, the internal link has a data width equal to the size of the largest data vector capable of being read at once from said memory circuit.

According to an embodiment, the internal link has a data width at least twice greater than the data width of the port of connection of the device to the processor.

According to an embodiment, the direct transfer circuit is connected to a port of connection of the module to a memory system bus external to the device.

According to an embodiment, the port of connection of the device to the memory system bus has a data width greater than the data width of the port of connection of the device to the processor.

According to an embodiment, the buffer circuit of the direct transfer circuit is adapted to temporarily storing data transiting between said memory circuit and an external memory circuit coupled to said memory system bus.

According to an embodiment, the direct transfer circuit comprises configuration registers storing the second instructions received from the processor.

According to an embodiment, the direct transfer circuit further comprises a second control circuit adapted to reading from and writing into the configuration registers, to exchanging control data with the arbitration circuit, and to controlling data transfers via the buffer circuit.

According to an embodiment, said memory circuit comprises a plurality of memory circuits adapted to implementing computing operations, said memory circuits being arranged in an array of rows and columns.

According to an embodiment, the array of memory circuits is reconfigurable to adjust the dimensions of the data vectors in the row direction.

An embodiment provides a system comprising a memory device, a processor adapted to transmitting the first and second instructions to the memory device, a memory system bus coupled to the direct transfer circuit of the memory device, and an external memory circuit coupled to the memory system bus, wherein the direct transfer circuit is adapted to transferring data directly between the memory circuit of the device and the external memory circuit via the memory system bus, without transiting through the processor.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the different elements of the described memory modules and systems has not been detailed, the forming of these elements being within the abilities of those skilled in the art based on the indications of the present description. In particular, the forming of the memory circuits adapted to implementing computing operations has not been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

Unless specified otherwise, the expressions "around", "approximately", "substantially" and "in the order of" signify within 10%, and preferably within 5%.

Figure 1:
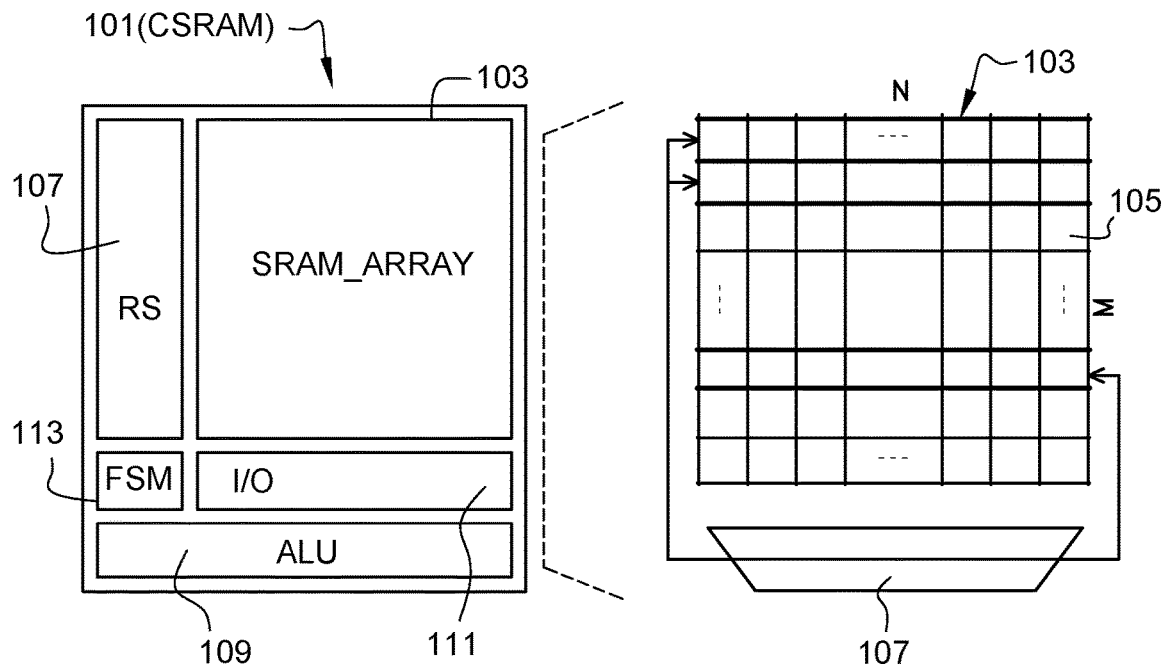
FIG. 1 schematically shows an example of a memory circuit capable of implementing computing operations.

FIG. 1 schematically shows an example of a memory circuit 101 (CSRAM) capable of implementing computing operations. Circuit 101 comprises an array 103 (SRAM_ARRAY) of elementary storage cells, for example, SRAM ("Static Random Access Memory") cells. In the right-hand portion of the drawing, certain elements of memory circuit 101, and in particular the array 103 of elementary storage cells, have been shown in further detail. In this example, array 103 comprises M rows and N columns of elementary storage cells 105, M and N being integers greater than or equal to 2. As an example, array 103 is similar to the arrays described in patent application EP3252774 previously filed by the applicant.

Memory circuit 101 further comprises a row selection circuit 107 (RS) adapted to selecting a single row of array 103 to perform a conventional read or write operation. Row selection circuit 107 may further be adapted to simultaneously selecting a plurality of rows of array 103, to implement, on column output conductive tracks of the array, the basic logic operations having as operands data stored in the selected rows.

Memory circuit 101 may further comprise a computing circuit 109 (ALU) adapted to implementing additional computing operations from the signals read from the column output conductive tracks of array 103 and/or to directly rewriting into array 103 the result of a computing operation, without transiting through external connection terminals of memory circuit 101.

Memory circuit 101 further comprises an input/output circuit 111 (I/O) coupling the array columns to terminals of connection to the outside of the memory circuit, for example to a data input/output port (not detailed in FIG. 1) of the memory circuit.

The memory circuit of FIG. 1 further comprises a control circuit 113 (FSM) coupled to circuits 107, 109, and 111. Circuit 113 is adapted to decoding and controlling the execution of read, write, and/or computing instructions transmitted by an external control circuit (not shown), for example, a processor.

Patent application EP3503103 previously filed by the applicant describes an example of integration of a memory circuit adapted to implementing computing operations in a system comprising a processor. In this system, the read and write accesses to the memory circuit adapted to implementing computing operations are carried out via the processor. This may slow down the system when significant quantities of data are transferred from or to the memory circuit adapted to implementing computing operations.

Figure 2:
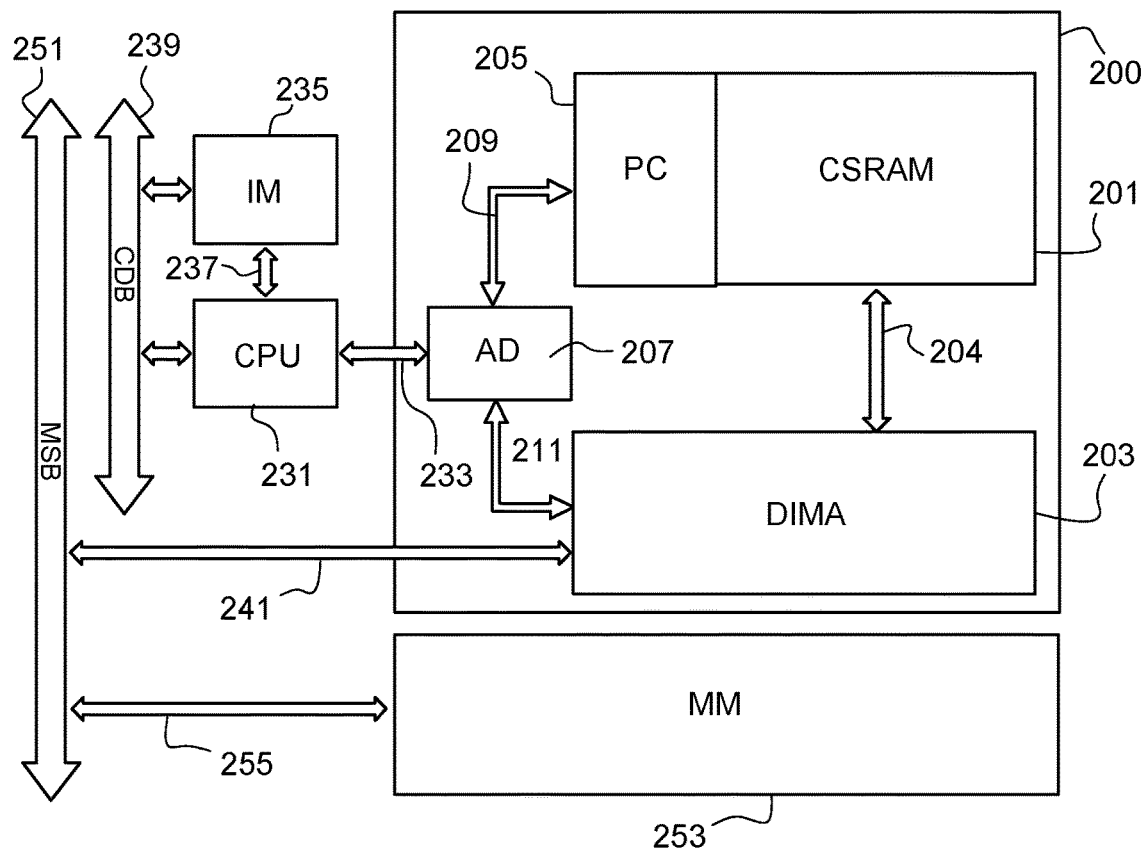
FIG. 2 schematically shows an example of a system comprising a memory module adapted to implementing computing operations and a data transfer circuit coupled to said memory module according to an embodiment.

FIG. 2 schematically shows an example of a system comprising a memory module 200 adapted to implementing computing operations according to an embodiment.

The memory module 200 of FIG. 2 comprises a memory circuit 201 (CSRAM) adapted to implementing computing operations.

Memory circuit 201 may be a memory circuit of IMC ("In Memory Computing") type, that is, where computing operations are implemented directly inside of the array of elementary cells of the memory circuit, for example, as described in relation with FIG. 1 or in the above-mentioned patent application EP3252774. More generally, memory circuit 201 may be any memory circuit adapted to implementing computing operations, for example a circuit of NMC ("Near Memory Computing") type, that is, where the computing operations are not performed directly within the array of elementary cells of the memory circuit, but in integrated computing circuits at the immediate periphery of the array of elementary cells.

The system of FIG. 2 comprises a processor 231 (CPU). More generally, processor 231 may be replaced with any circuit adapted to generating a flow of control instructions. The system of FIG. 2 further comprises an instruction memory 235 (IM) directly coupled to processor 231 via a link 237. Processor 231 and instruction memory 235 are further coupled to a same system bus 239 (CDB), also called processor system bus or processor data bus or CPU data bus ("CPU data bus"). Bus 239 may be a bus of the type conventionally used to exchange data between a processor and peripherals, for example, memory circuits, of a data processing system. Bus 239 may in particular comprise a data bus, an address bus, and/or a control bus. Bus 239 may be implemented by means of a distributed interconnection system of network on chip type.

According to an aspect of an embodiment, module 200 further comprises a circuit 203 (DIMA) of direct access to circuit 201. Circuit 203 is directly coupled to memory circuit 201, via a data transfer link 204 internal to module 200. Circuit 203 is further directly coupled to a data transfer system bus 251 (MSB), also called memory system bus external to module 200, via a link 241. In this example, memory system bus 251 is not directly connected to processor 231. Bus 251 is a bus specifically dedicated to the direct transfer (i.e. without transiting through processor 231) of data between the memory circuit 201 of module 200 and other peripheral circuits of the system, for example, a distant memory, or any other internal or external memory likely to exchange data with memory circuit 201. Bus 251 may in particular comprise a data bus, an address bus, and/or a control bus. Bus 251 may be implemented by means of a distributed interconnection system of network on chip type.

It should be noted that system memory bus 251 and system bus 239 may advantageously be coupled to one another by different interface circuit as known by those skilled in the art. Further, system bus 239 and memory system bus 251 may be one and the same bus, even if this is not the preferred embodiment. Indeed, system 239 is often of small size for the data and putting the two buses in common would probably result in having a bus 251 of small size, and further in increasing the necessary flow rate on the common bus, which might in practice result in a saturation of the bus, and indirectly in a decrease of the data exchange flow rate with respect to a configuration with two buses.

Preferably, memory system bus 251 is wider than processor system bus 239. Data transfer link 204 preferably has a width equal to the size of the largest data vector capable of being read at once from memory circuit 201, for example, equal to the size of a row of readout circuits present at the feet of columns in the array of elementary storage cells of memory circuit 201. In the case where there is no multiplexing at the column feet, the size of this largest data vector may be equal to N bits if the example of FIG. 1 is considered. In the case where there is a multiplexing at the column foot, then the size of this largest vector will be decreased by the multiplexing factor with respect to this number N of bits present in a row. As a variant, link 204 may have a width equal to a sub-multiple of the size of the largest data vector capable of being read at once from memory circuit 201. Bus 251 may have a width equal to the width of link 204. As a variant, the width of bus 251 may be a sub-multiple of the width of link 204. The width of link 204 is preferably greater than the width of an input/output port of processor 231. It should be noted that width of a bus, of a port, or of a link here means the width of the data capable of transiting in parallel over the bus, the port, or the link (independently from possible additional address and/or control signals).

Direct access circuit 203 is adapted to transferring data directly, without having these data transit through processor 231, between memory circuit 201 and memory system bus 251. In the shown example, the system further comprises a memory circuit 253 (MM) external to module 200. Memory circuit 253 is coupled to memory system bus 251 via a link 255. Thus, direct access circuit 203 enables to transfer these data directly, that is, without having these data transit through processor 231, between the memory circuit 201 of module 200 and external memory circuit 253. More generally, direct access circuit 203 enables to transfer data directly, that is, without having these data transit through processor 231, between the memory circuit 201 of module 200 and any peripheral circuit connected to memory system bus 251. As non-limiting examples, memory circuit 253 may be a SRAM-type memory, a memory of NVM ("Non-volatile Memory) type, a memory of DRAM ("Dynamic Random Access Memory") type, a Flash-type memory, or also another memory circuit adapted to implementing computing operations. The different components of module 200 may be integrated in a same integrated circuit chip. Memory circuit 253 may be integrated to this same chip, or external to this chip.

In the example of FIG. 2, module 200 further comprises a control circuit 205 (PC, for Pipeline Controller) adapted to organizing the accesses to memory circuit 201 required by processor 231. Circuit 205 is adapted to decoding the instructions received from processor 231 and to breaking down, if necessary, each received instruction into a sequence of a plurality of sub-operations also called elementary operations. Elementary operation means an operation of reading from, writing into, or computing in memory 201. A computing operation may possible comprise only actuating a computing unit appended to the memory array (in the case for example of an NMC-type memory). A computing operation may also comprise performing an operation of reading from one or a plurality of rows with the actuation of computing means placed at the column foot (in the case, for example, of an IMC-type memory). Generally, it can be considered that an elementary operation can be performed within a cycle of access to memory 201, as for example described in French patent application N°20/08272 filed on Aug. 4, 2020 by the applicant in relation with FIGS. 4A, 4B.

The instructions sent by the processor may be simple instructions corresponding to a single request for writing into or reading from the memory without computing operations, or may be complex instructions capable of requiring in practice the execution of a plurality of elementary read, write, or computing operations. Thus, circuit 205 will perform a breaking down of a received instruction into a sequence of a plurality of elementary operations only when it receives a smart instruction.

The smart instructions are, after decoding, transformed into a flow of elementary operations or, in other words, a sequence of elementary operations. For example, if a complex instruction corresponds to the AND operation between two operands and to the storing of the result, the elementary sequence corresponding to this complex instruction will for example correspond to:

- in the case of an NMC memory: 1/read first operand, 2/read second operand, 3/calculate AND operation, 4/write result;
- in the case of an IMC memory: 1/read operands 1 and 2 by multi selection of rows and configuration of the readout circuit to perform an AND operation during the reading, 2/write the result.

In the case where memory 201 may, due to its structure, simultaneously perform a plurality of elementary operations, it is then possible to parallelize certain elementary operations. Thus, it is possible to start a sequence of operations corresponding to an n-th instruction without having finished the execution of an (n−1)-th instruction. In other words, parallelized elementary operations may correspond to different simple or complex instructions. To avoid errors of execution of the sequence of received instructions linked to this possibility of parallelization, circuit 205 may in this case include a device for analyzing the sequences of operations corresponding to the successive instructions, to insert if need be one or a plurality of waiting cycles in a sequence of elementary operations corresponding to an instruction, when a potential conflict is detected.

The module 200 of FIG. 2 further comprises a circuit 207 (AD) for distributing the requests from processor 231. Circuit 207 is coupled to processor 231 via a link 233. Circuit 207 is further coupled to the control circuit 205 of memory circuit 201 by a link 209 internal to module 200, and to direct access circuit 203 by a link 211 internal to module 200. Circuit 207 enables to control the distribution of the instruction flow originating from processor 231 between, on the one hand, memory circuit 201 (via link 209 and control circuit 205) and, on the other hand, direct access circuit 203 (via link 211). A mechanism of memory mapping type may be provided to perform the routing of the instructions to one or the other of memory circuit 201 and of direct access circuit 203, according to an addressing field contained in the instruction. As known per se, this memory mapping mechanism aims at performing an association between a seen/known address of the processor and an address understandable by the hardware, here memory 201 or direct access circuit 203.

Processor 231 may require read or write accesses to memory circuit 201, or also the execution of computing operations by memory circuit 201. The processor may further require direct transfers (via circuit 203) of data between memory circuit 201 and a peripheral circuit external to module 200, for example, memory circuit 253. These requests are distributed between control circuit 205 and direct access circuit 203 by distribution circuit 207.

In the system of FIG. 2, module 200 is coupled or connected to the processor by a link or connection port 233. The width of connection port 233 is smaller than the width of the internal link 204 of module 200. As an example, the width of connection port 233 is at least twice smaller than and preferably at least four times smaller than the width of internal link 204. As an example, the width of link 233 is equal to 32 bits.

The relatively large width of internal link 204 enables in fine to transfer, via direct transfer circuit 203, more significant data volumes than in the case where data bus 204 is of same size, for the data, as connection port 233. Indeed, for a memory access requested by direct transfer circuit 203, it is possible to write/read in parallel more data by transiting through internal link 204 than by transiting through connection port 233 from/towards CPU 231.

It should be noted that the use of a direct transfer circuit 203 associated with a memory 201 enabling to perform a computing, particularly a computing of SIMD ("Single Instruction Multiple Data") type, enables to have as a very large majority data write/read operations into/from the memory which transit through direct transfer circuit 203. The exchanges between the CPU and memory 201 are then mainly transfers of "instructions" aiming at launching computing operations (SIMD) and very little conventional transfers comprising performing a simple data reading or writing from or into the memory (without launching computing operations).

Figure 3:
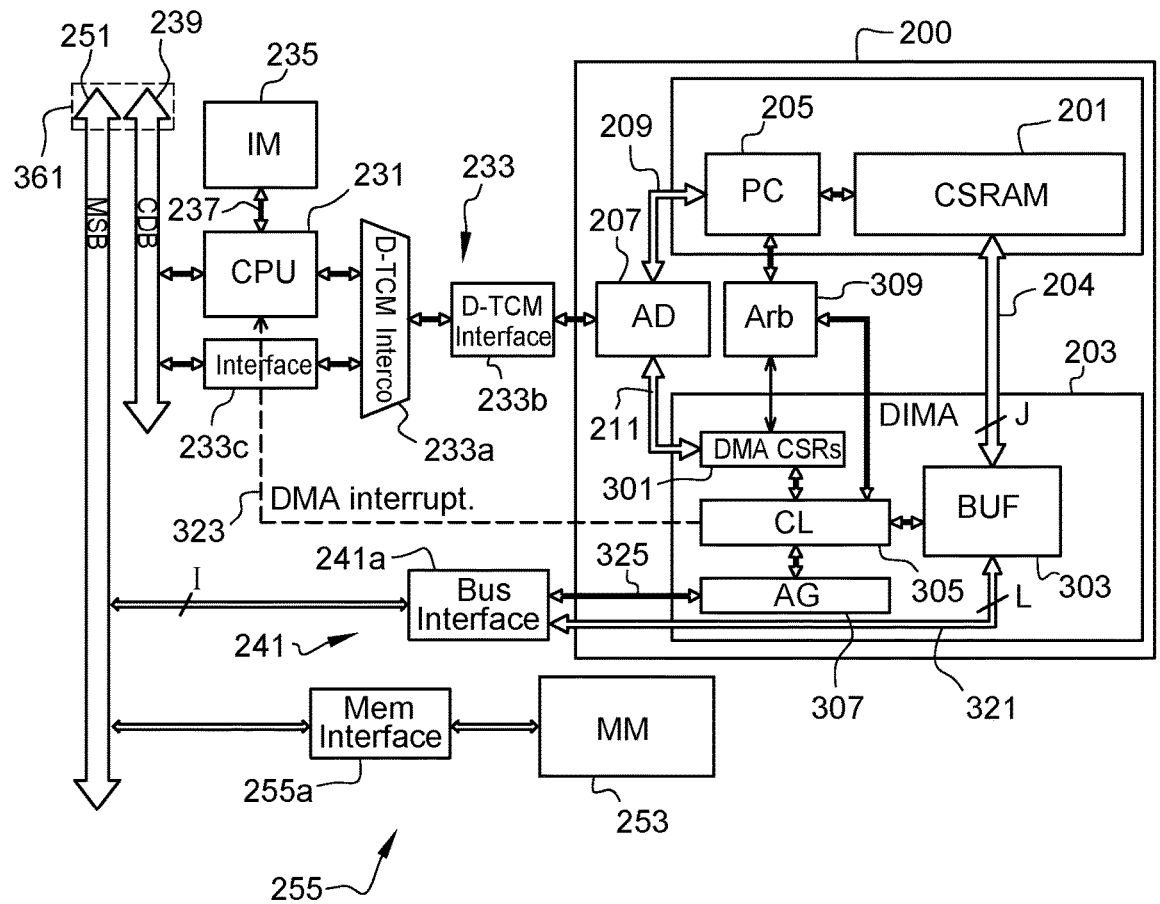
FIG. 3 illustrates in further detail an example of implementation of the system of FIG. 2.

FIG. 3 illustrates in further detail an example of implementation of the system of FIG. 2.

The system of FIG. 3 comprises the same elements as in the example of FIG. 2, arranged substantially in the same way.

In the example of FIG. 3, different elements of the direct access circuit 203 of module 200 have been shown in further detail.

More particularly, in this example, circuit 203 comprises an assembly 301 (DMA CSRs) of state registers also called configuration registers also called configuration registers receiving the instructions from processor 231, via link 211. Registers 301 store the transfer instructions to be executed by circuit 203. As an example, registers 301 store the source and destination addresses of the transfers to be performed. Registers 301 may further store the size of the data blocks to be transferred. The transfer instructions stored in registers 301 may further comprise instructions specific to direct access circuit 203 for rearranging the data inside of direct access circuit 203, to enable to modify the arrangement of the data during their transfer between the source and the destination.

Circuit 203 further comprises a buffer circuit 303 (BUF) coupled to memory circuit 201 via internal link 204, and to memory system bus 251 via a data transfer link 321. Buffer circuit 303 temporarily stores the data transiting from memory circuit 201 to memory system bus 251, or from memory system bus 251 to memory circuit 201.

Circuit 203 further comprises a logic control circuit 305 (CL). Logic control circuit 305 is coupled on the one hand to state registers 301 and on the other hand to buffer circuit 303. Circuit 305 is adapted to controlling data transfers possibly inside of buffer circuit 303, but especially between buffer circuit 303 and links 204 and 321, according to the state of the execution of an instruction previously stored in registers 301. When the execution of a data transfer instruction required by processor 231 is finished, logic control circuit 305 sends an interrupt to processor 231 to inform it thereof. The interrupt may be transmitted over a link 323 (DMA interrupt) connecting circuit 305 to processor 231.

Circuit 203 further comprises an address generation circuit 307 (AG). Circuit 307 is coupled to logic control circuit 305. Circuit 307 is further coupled to memory system bus 251 via an address signal transfer link 325. Address generation circuit 307 is adapted to generating an address signal sequence to successively transfer the data between buffer circuit 303 and bus 251, according to the instructions stored in regions 301.

In the example shown in FIG. 3, the link 241 coupling direct access circuit 203 to memory system bus 251 comprises a bus interface circuit 241a (Bus Interface). Circuit 241a is for example a master bus interface circuit. Circuit 241a comprises a first port coupled, for example, connected, to bus 251, and a second port coupled, for example, connected, respectively to a data input/output port of buffer circuit 303 (via link 321) and to an address signal input/output port of address generator 307 (via link 325).

In the example of FIG. 3, the link 255 coupling memory system bus 251 to external memory circuit 253 comprises a bus interface circuit 255a (Mem Interface). Circuit 255a is for example a slave bus interface circuit. Circuit 255a comprises a first input/output port coupled, for example, connected, to bus 251, and a second input/output port coupled, for example, connected, to an input/output port of memory circuit 253.

Further, in the example of FIG. 3, the link 233 coupling processor 231 to access distribution circuit 207 comprises a multiplexer 233a (D-TCM interco) and an interface circuit 233b (D-TCM interface). Interface circuit 233b is for example a slave interface circuit. Multiplexer 233a comprises a first input/output port coupled, for example, connected, to an input/output port of processor 231. Multiplexer 233a further comprises a second input/output port directly coupled (that is, without passing through processor 231) to the processor system bus 239 of the system. In the shown example, a bus interface circuit 233c (Interface), for example a slave interface circuit, forms an interface between processor system bus 239 and the second input/output port of multiplexer 233a. Interface circuit 233c comprises a first input/output port coupled, for example, connected, to bus 239, and a second input/output port coupled, for example, connected, to the second input/output port of multiplexer 233a. Multiplexer 233a further comprises a third input/output port coupled, for example, connected, to a first input/output port of interface circuit 233b. Interface circuit 233b has a second input/output port coupled, for example, connected, to an input/output port of circuit 207. In operation, the multiplexer is adapted to alternately connecting one or the other of its first and second input/output ports to its third input/output port, to couple the input/output port of access distribution circuit 207 either to processor 231 or directly to processor system bus 239.

In the example of FIG. 3, module 200 further comprises an arbitration circuit 309 coupled, for example, connected, on the one hand, to the control circuit 205 of memory circuit 201 and, on the other hand, to the control circuit 305 of direct access circuit 203. Arbitration circuit 309 may further be coupled, for example, connected, to the configuration registers 301 of direct access circuit 203. Circuit 309 is adapted to managing the execution of the instructions carried out in fine by memory circuit 201 to arbitrate between potentially simultaneous access requests originating from processor 231 or from direct access circuit 203. More particularly, while circuit 207 has the function of distributing the instructions received from processor 231 respectively to the control circuit 205 of the memory circuit 201 of module 200 and to the configuration registers 301 of the direct access circuit 203 of module 200, arbitration circuit 309 (Arb) manages possible conflicts between requests for carrying out the elementary operations in memory circuit 201 during the execution of the instructions requested by the processor either directly from the memory circuit or from direct access circuit 203. More specifically, each instruction is broken down into a sequence of elementary operations by control circuit 205 or by control circuit 305. In other words, arbitration circuit 309 performs an arbitration between two different parallel flows of elementary operation requests, that is:

a first flow corresponding to the instructions sent by processor 231 to memory circuit 201, generated by control circuit 205; and a second flow corresponding to the execution of the data transfers between memory circuit 201 and external memory 253, generated by control circuit 305.

The requests received by arbitration circuit 309 from control circuit 205 and from control circuit 305 are authorized or delayed by the arbitration circuit according to the possible conflicts of requests of access to memory circuit 201. In other words, arbitration circuit 309 transmits to the control circuit 205 of memory circuit 201 a single elementary operation request flow, called general flow, corresponding to an interlaced combination of the first and second flows, according to a sequencing defined by predefined priority rules. The granularity of the interlacing of the first and second flows may be at the scale of the elementary operations, or at a higher-level scale, that is, at an elementary operation group scale.

The instructions sent by processor 231 to control circuit 205 or written into configuration registers 301 may comprise priority bits used in fine by arbitration circuit 309 to decide of the order of processing of the elementary operations. Thus, according to an embodiment, the first and second elementary operation request flows received by arbitration circuit 309 may each include one or a plurality of priority bits indicating the corresponding priority of each elementary operation according to the priority indicated by the processor during the sending of the corresponding instruction. In the case, for example, where arbitration circuit 309 simultaneously receives elementary operation requests for each of the first and second flows, then a default rule may be given for their processing. Priority may for example be always given to the first flow or priority may be alternately given between the two flows.

The link 204 coupling memory circuit 201 to direct access circuit 203, enabling to perform direct data transfers (without transiting through processor 231) between memory circuit 201 and distant memory 253 is for example adapted to only transmitting data signals corresponding to the data read from or to be written into memory circuit 201 and respectively corresponding to data written into or read from buffer circuit 303.

The width of the data capable of being simultaneously transmitted via link 204 is for example equal to or greater than the width of memory system bus 251. The described embodiments are however not limited to this specific case.

For each elementary operation request of the second flow, address and control signals used to indicate the address of each piece of data to be transferred, the type of access to be performed (reading or writing), the size of the piece of data to be transferred, etc., may be transmitted by circuit 305 to the control circuit 205 of memory circuit 201, via the arbitration circuit or possibly directly. Whatever the embodiment, it is necessary to provide a synchronization mechanism between the arbitration circuit, control circuit 205, and the direct transfer circuit to ascertain that the address and control signals corresponding to an elementary operation request transmitted by logic circuit 305 are taken into account by the memory circuit for the execution of the elementary operation at the same time as the data to be written into or read from buffer circuit 303 transit over link 204 for this same elementary operation. Thus, for example, it may be provided for an elementary operation request transmitted to the arbitration circuit by logic circuit 305 to include all the address and control information and for the arbitration circuit to send to logic circuit 305 information, of acknowledgement request type, to signify thereto that it launches the execution of the elementary operation in memory circuit 201, and then that the data transfer circuit can send data over link 204 (in the case of a writing into memory circuit 201) or recover data over link 204 (in the case of a reading from memory circuit 201). Other synchronization mechanisms between arbitration circuit 309, memory circuit 201, and direct transfer circuit 203 may of course be implemented.

Further, the arbitration circuit has been previously shown as a circuit different from the control circuit 205 of memory circuit 201 to mainly highlight the arbitration function, role, indispensable to the implementation of a circuit according to the present invention where two elementary operation request flows desire access to a same resource, that is, array 103 and the memory computing means (for example, 107). This arbitration function may for example be performed by the control circuit 205 of memory circuit 201. Control circuit 205 would thus have a direct dialog with logic circuit 305 and more generally direct transfer circuit 203; control circuit 205 would thus receive, via two input/output ports, instruction requests from processor 231 and instruction requests from circuit 203 in the form of elementary operation requests, or possibly in the form of higher-level instructions to be decoded by circuit 205 by for example using the same decoder as that used to decode the instructions originating from processor 231. According to another embodiment, the instruction decoder circuit present in control circuit 205 is "offset" in arbitration circuit 309 and control circuit 205 processes and receives a single general operation request flow sent by arbitration circuit 309.

Figure 4:
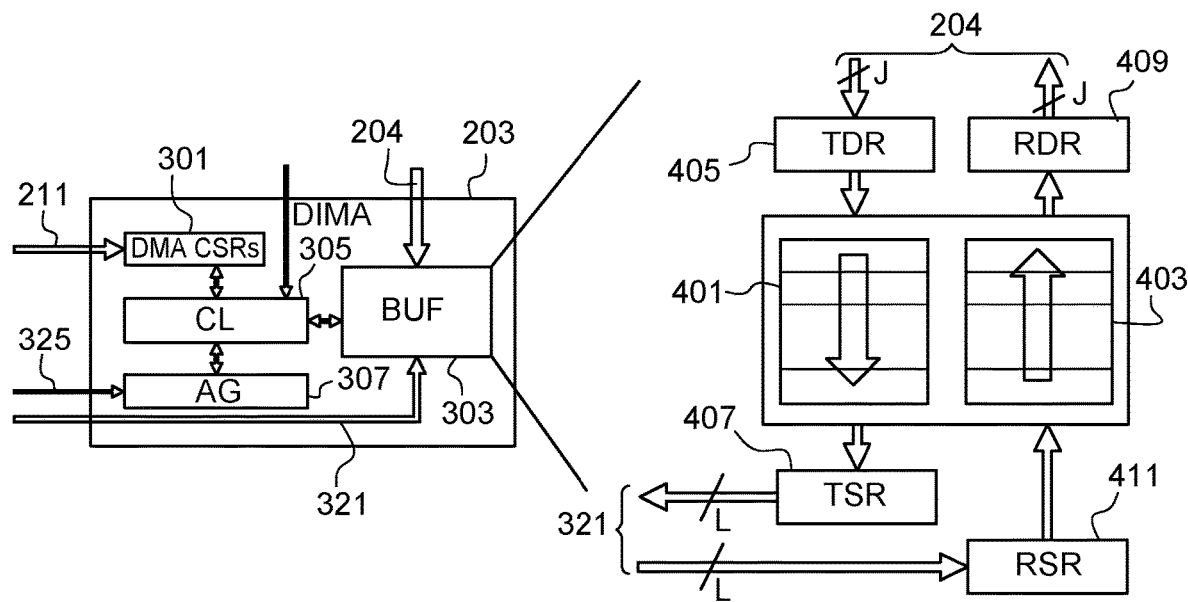
FIG. 4 shows an example of embodiment of a data transfer circuit of the memory module of FIG. 3.

FIG. 4 shows in further detail an example of embodiment of the direct data transfer circuit 203 of the memory module 200 of FIG. 3.

More particularly, in FIG. 4, an example of embodiment of the buffer circuit 303 of circuit 203 has been shown in further detail (in the right-hand portion of the drawing).

In this example, buffer circuit 303 comprises two unidirectional transfer circuits 401 and 403 of FIFO ("First In First Out") type. Circuit 401 is adapted to transmitting data from the memory circuit 201 of module 200 to memory system bus 251. Circuit 403 is adapted to transmitting data from memory system bus 251 to memory circuit 201. Circuit 401 comprises an input port coupled to an output port of memory circuit 201 (not shown in FIG. 4), via internal link 204. In this example, a data transmission register 405 (TDR) forms an interface between link 204 and the input port of circuit 401. Circuit 401 further comprises an output port coupled to memory system bus 251, via link 321. In this example, a data transmission register 407 (TSR) forms an interface between the output port of circuit 401 and link 321. Circuit 403 comprises an output port coupled to an input port of memory circuit 201, via internal link 204. In an example, a data transmission register 409 (RDR) forms an interface between the output port of circuit 403 and link 204. Circuit 403 further comprises an input port coupled to memory system bus 251, via link 321. In this example, a data transmission register 411 (RSR) forms an interface between link 321 and the input port of circuit 403.

Circuits 401 and 403 enable to temporarily store the data during their transfer from memory circuit 201 to memory system bus 251 or from memory system bus 251 to memory circuit 201. More generally, any other arrangement of buffer circuit 303 adapted to fulfilling this function may be provided.

Buffer circuit 303 may further have a function of adaptation of the size of the data between link 204 and link 321. As an example, link 204 may have a data width J, link 321 may have a data width L, and memory system bus 251 may have a data width I, with J, L, and I integers greater than 1. Width J may be equal to width L. As a variant, width J may be different from width L. In this case, buffer circuit 303 is configured to adapt the size of the transmitted data. For example, width J may be greater than width L. The adaptation of the size of the data may be performed by registers 405, 407, 409, and 411. As an example, registers 409 and 411 may be shift registers. Further, width I may be equal to width L, or different from width L. As an example, width I is smaller than width L. The size adaptation of the data (serialization) between link 321 and memory system bus 251 may be performed by interface circuit 241a.

As a non-limiting example, width J is equal to 2,048 bits, width L is equal to 512 bits, and width I is equal to 128 bits. The width of the words of buffers 401 and 403 is for example equal to width J, or to width L.

As an example, during a data transmission from memory system bus 251 to memory circuit 201, buffer 403 is successively filled with sub-words of width L until a full word of width J is available to be transmitted to memory circuit 201 via link 204. During a data transmission from memory circuit 201 to memory system bus 251, buffer 401 is read in sub-words of width L, successively transmitted to memory system bus 251 via link 321.

From the programming point of view, the direct access circuit 203 of module 200 is controlled by processor 231 via state registers 301. Dedicated instructions are used to control data transfers via circuit 203.

Write accesses to the memory circuit 201 of module 200, for example, to transfer data from external memory 253 to memory circuit 201, via interface circuit 241a and direct access circuit 203, may be implemented as follows. First, processor 231 writes a full transfer instruction into the configuration registers 301 of circuit 203 via interface circuit 233b and circuit 207 of distribution of the instructions of module 200. The instruction particularly comprises the source address of the data to be transferred (that is, the address of the data in external memory 253), the size of the data block to be transferred, the destination address of the data to be transferred (that is, the address of the data in memory circuit 201), and possibly an instruction for rearranging the data during the transfer. The logic control circuit 305 of circuit 203 then generates a request for accessing in read mode to memory 253 at the specified source address (supplied by address generator 307). This request is sent by the interface circuit 241a of module 200 to the interface circuit 255a of external memory circuit 253, via memory system bus 251. When the source data are ready, external memory 253 sends all the required data, for example, in a continuous burst, directly in the buffer circuit 303 of circuit 203, via interface circuits 255a and 241a and memory system bus 251. The data are then transferred from buffer circuit 303 to memory circuit 201, via the internal link 204 of module 200, when arbitration circuit 309 authorizes this transfer. This transfer may be a continuous transfer as the data are made available at the output of buffer circuit 303. As a variant, it may be waited for all the data to be available in buffer circuit 303 to perform the transfer to memory circuit 201. The selection of the transfer mode may be performed according to a possible operating frequency difference between external memory 253 and the memory circuit 201 of module 200. During the transfer, the destination addresses are communicated to the control circuit 205 of memory circuit 201 by arbitration circuit 309. When the execution of the transfer instruction is over, an interrupt is returned by control circuit 305 to the processor.

Read accesses to the memory circuit 201 of module 200, for example, to transfer data from memory circuit 201 to external memory 253, via the direct access circuit 203 of module 200 and interface circuit 241a, may be performed according to a path inverse to what has been described. Processor 231 first writes the complete instruction into the configuration registers 301 of circuit 203, via interface circuit 233b and circuit 207 for distributing the instructions of module 200. The logic control circuit 305 of circuit 203 then generates a request for a read access to memory circuit 201 at the specified source address. This request is transmitted to memory circuit 201 via arbitration circuit 309 and control circuit 205. The data are then transferred from memory circuit 201 to buffer circuit 303 via link 204. The content of buffer circuit 303 is then transferred to the destination address of external memory 253, via link 321, interface circuit 241a, memory system bus 251, and interface circuit 255a.

In the system of FIG. 3, accesses to the data of the memory circuit 201 of module 200 may also be directly performed by processor 231 or processor system bus 239, via link 233 and in particular via interface circuit 233b. For example, data may be transferred from external memory 253 to the memory circuit 201 of module 200, through, in the order: memory system bus 251, a system interconnection circuit 361 coupling bus 251 to the processor system bus 239 of the processor, processor system 239, interface circuit 233c, interface circuit 233b, distribution circuit 207, and control circuit 205. To transfer data from memory circuit 201 to external memory 253, the inverse path may be used. Such transfers may however be relatively long and block the access to the processor for a significant time period. An advantage of direct access circuit 203 is to allow direct data transfers from or to memory circuit 200, without blocking the access to the processor.

Examples of implementation where module 200 comprises a single memory circuit 201 adapted to implementing computing operations have been described hereabove.

As a variant, the assembly comprising control circuit 205 and circuit 201 may be replaced with a module comprising a plurality of elementary blocks, each comprising a memory circuit adapted to implementing computing operations, for example of the type described in the above-mentioned French patent application N°20/08272 or also in the article entitled "Reconfigurable Tiles of Computing-In-Memory SRAM Architecture for Scalable Vectorization" of R. Gauchi et al. (Proceedings of the ACM/IEEE International Symposium on Low Power Electronics and Design—August 2020).

Figure 5:
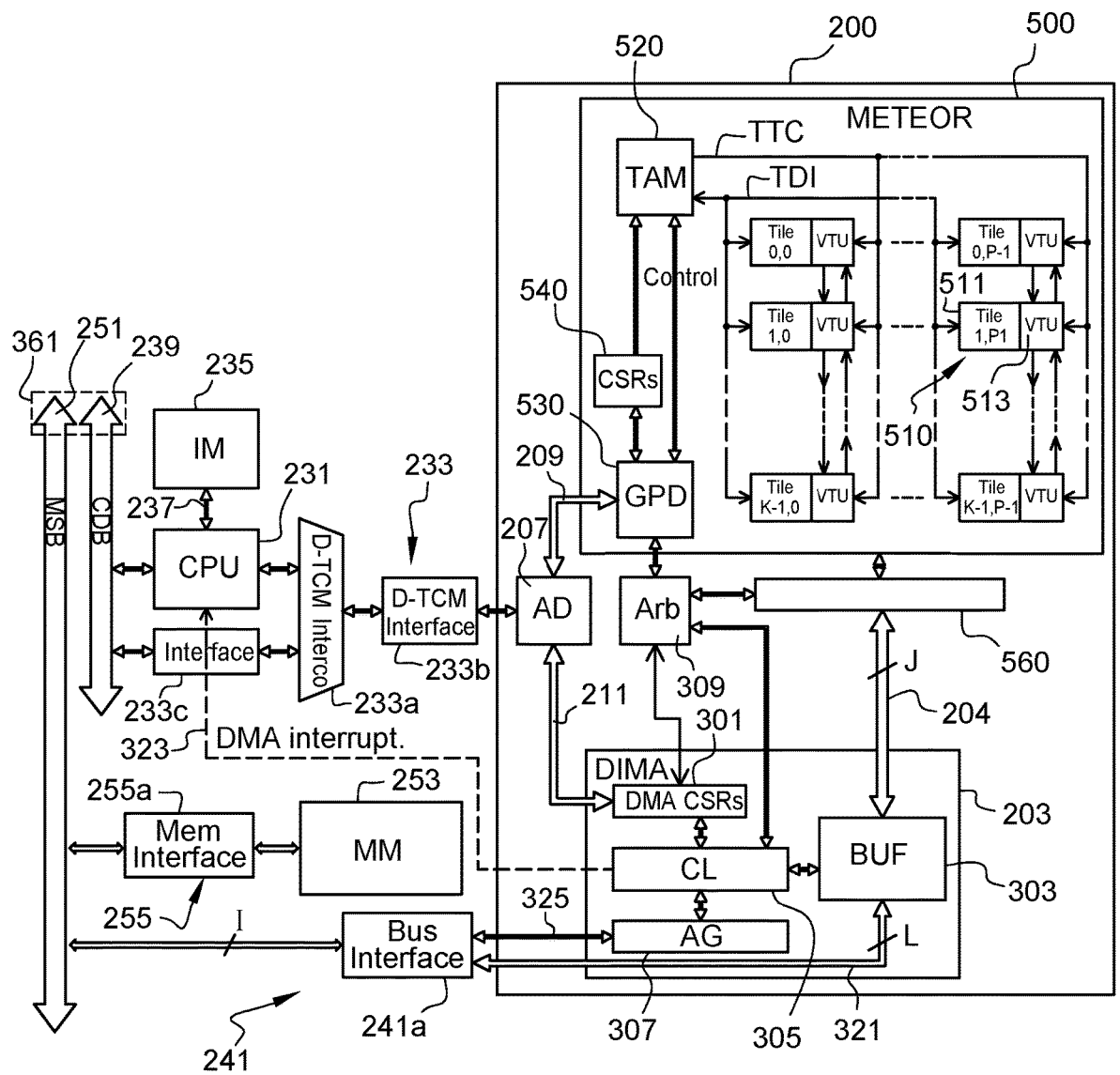
FIG. 5 illustrates another example of a system comprising a memory module adapted to implementing computing operations and a data transfer circuit coupled to said memory module according to another embodiment.

FIG. 5 illustrates an example of a system comprising a memory module adapted to implementing computing operations according to another embodiment.

The system of FIG. 5 is similar to the system of FIG. 3 and differs from the system of FIG. 3 essentially in that, in the system of FIG. 5, the assembly comprising control circuit 205 and circuit 201 has been replaced with a module 500 (METEOR).

Module 500 is a reconfigurable module comprising a plurality of elementary blocks 510 arranged in an array of K rows and P columns, P being an integer greater than or equal to 1, preferably greater than or equal to 2, for example, greater than or equal to 3, and K an integer greater than or equal to 1, preferably greater than or equal to 3.

Each elementary block 510 comprises a memory circuit 511, also designated with reference "Tile i,j", i being an integer in the range from 0 to K 1 (Tile 0,0; Tile 1,0; Tile K 1,0) and j an integer in the range from 0 to P 1 (Tile 0,P 1; Tile 1,P 1; Tile K 1,P 1) respectively designating the position of the row and the position of the column of the elementary block in the array. Each memory circuit 511 is adapted to implementing computing functions. More particularly, each memory circuit 511 is adapted to loading and storing data, and to implementing a number of logic and/or arithmetical operations having as operands the data stored in memory circuit 511. Each memory circuit 511 is for example identical or similar to the memory circuit 201 of FIG. 3. Each elementary block 510 further comprises a vertical transfer circuit 513, also designated with reference VTU, coupled to the memory circuit 511 of the block.

In each column of the array, the configurable transfer circuits 513 of any adjacent two elementary blocks 510 of the column are coupled two by two by an uplink bus VTI-U and by a downlink bus VTI-D. In other words, in each column of the array, in each elementary block 510 of rank i of the column except for the elementary blocks of the first (i=0) and last (i=K−1) rows of the array, the vertical transfer circuit 513 of the block is coupled, for example, connected, to the vertical transfer circuit 513 of the elementary block 510 of rank i−1 by an uplink bus VTI-U and by a downlink bus VTI-D and is coupled, for example connected, to the vertical transfer circuit 513 of the elementary block 510 of rank i+1 by another uplink bus VTI-U and by another downlink bus VTI-D.

In each column, the vertical transfer circuit 513 of the elementary block 510 of rank i=0 is coupled, for example, connected, to the vertical transfer circuit 513 of the elementary block 510 of rank i=1 by an uplink bus VTI-U and by a downlink bus VTI-D. Further, in each column, the vertical transfer circuit 513 of the elementary block 510 of rank i=K−1 is coupled, for example, connected, to the vertical transfer circuit 513 of the elementary block 510 of rank i=K−2 by an uplink bus VTI-U and by a downlink bus VTI-D.

In this example, in each column of the array, in each elementary block 510 of rank i of the column, except for the elementary blocks 510 of the first (i=0) and last (i=K−1) rows of the array, the vertical transfer circuit 513 of the block is configurable to:

a) transmit, over a data writing bus (not detailed in FIG. 1) of the memory circuit 511 of the block, one or the other of:
   a data word received on the downlink bus VTI-D coupling the vertical transfer circuit 513 of elementary block 510 to the vertical transfer circuit 513 of the adjacent elementary block 510 of rank i−1 in the column; and
   a data word received on the uplink bus VTI-U coupling the vertical transfer circuit 513 of elementary block 510 to the vertical transfer circuit 513 of the adjacent elementary block 510 of rank i+1 in the column;

d) transmit over the uplink bus VTI-U coupling the vertical transfer circuit 513 of elementary block 510 to the vertical transfer circuit 513 of the adjacent elementary block 510 of rank i−1 in the column one or the other of:
   a data word received over a data reading bus (not detailed in FIG. 1) of the memory circuit 511 of the elementary block; and
   a data word received over the uplink bus VTI-U coupling the vertical transfer circuit 513 of elementary block 510 to the vertical transfer circuit 513 of the adjacent elementary block 510 of rank i+1 in the column; and c) transmit, over the downlink bus VTI-D coupling the vertical transfer circuit 513 of elementary block 510 to the vertical transfer circuit 513 of the adjacent elementary block of rank i+1 in the column, one or the other of:
   a data word received over the data reading bus of the memory circuit 511 of the elementary block; and
   a data word received over the downlink bus VTI-D coupling the vertical transfer circuit 513 of elementary block 510 to the vertical transfer circuit 513 of the adjacent elementary block 510 of rank i−1 in the column.

In each column, the vertical transfer circuit 513 of the elementary block 510 of rank i=0 is for example adapted to:
   transmitting a data word received over the data reading bus from the memory circuit 511 of block 510 to the downlink bus VTI-D coupling block 510 to the vertical transfer circuit 513 of the adjacent elementary block 510 of rank i=1; and/or
   transmitting over the data writing bus of the memory circuit 511 of block 510 a data word received over the uplink bus VTI-U coupling block 510 to the vertical transfer circuit 513 of the adjacent elementary block 510 of rank i=1.

In each column, the vertical transfer circuit 513 of the elementary block 510 of rank i=K−1 is for example adapted to:
   transmitting a data word received over the data reading bus from the memory circuit 511 of block 510 to the uplink bus VTI-U coupling block 510 to the vertical transfer circuit 513 of the adjacent elementary block 510 of rank i=K−2; and/or
   transmitting over the data writing bus of the memory circuit 511 of block 510 a data word received over the downlink bus VTI-D coupling block 510 to the vertical transfer circuit 513 of the adjacent elementary block 510 of rank i=K−2.

The memory module 500 of FIG. 5 further comprises an internal circuit 520 (TAM) for controlling elementary blocks 510. Circuit 520 is particularly adapted to controlling the configuration of the vertical transfer circuits 513 of the elementary blocks 510 of the memory module. For this purpose, a control bus TTC internal to module 500 couples circuit 520 to control input ports (not detailed in the drawing) of the vertical transfer circuits 513 of the different elementary blocks 510 of the memory module.

Circuit 520 is further adapted to controlling the reading and the writing of data, as well as the implementation of computing operations, in the memory circuits 511 of the elementary blocks 510 of the memory module. For this purpose, a distribution bus TDI internal to module 500 couples circuit 520 to data input-output, address, and control ports (not detailed in the drawing) of the memory circuits 511 of the different elementary blocks 510 of the memory module.

Module 500 further comprises a general access regulation circuit 530 (GPD), as well as a configuration register circuit 540 (CSRs).

Circuit 530 is coupled to instruction distribution circuit 207 via link 209. Circuit 530 is adapted to sequencing the accesses to the elementary blocks 510 of the memory circuit, to avoid address conflicts during the execution of the instructions received from processor 231 (via circuit 207). For this purpose, circuit 530 receives the instructions from the processor (via circuit 207) and is adapted to inserting one or a plurality of waiting cycles between different steps of a same instruction when a potential conflict is detected. Circuit 530 is particularly adapted to sending control data to circuit 520, via a control bus designated with reference Control in FIG. 5. Circuit 530 is further adapted to exchanging control data with the arbitration circuit 309 of module 200. These exchanges are similar to the previously-described exchanges between arbitration circuit 309 and control circuit 205 (FIG. 3). In the example of FIG. 5, the data exchanged between arbitration circuit 309 and control circuit 530 may further comprise data of configuration of the array of elementary blocks 510. Such data of configuration of the array of elementary blocks 510, particularly the size of the data vectors, may be indicated in the instructions sent by processor 231 to direct transfer circuit 203, for example, on writing of the instructions into register 301. Further, logic circuit 305 may indicate to arbitration circuit 309 a data size to be considered during a write or read operation in memory circuit 500 requested by logic circuit 305.

Circuit 540 is adapted to storing configuration data used by circuit 520 to configure vertical transfer circuits 513. Circuit 520 is adapted to reading data from register circuit 540. Circuit 530 is adapted to reading and writing data from and into register circuit 540.

An advantage of the memory module 500 of FIG. 5 is that it is possible, via control circuit 520 and vertical transfer circuits 513, to virtually reconfigure the array of elementary blocks 510, either to extend the maximum dimension of the horizontal vectors capable of being processed by the memory module, particularly for the implementation of computing operations, or to increase the number of vectors capable of being processed (by decreasing the maximum dimension of said horizontal vectors).

In this example, the internal link 204 of module 200 couples the buffer circuit 303 of direct access circuit 203 to an input/output port (not detailed in the drawing) of reconfigurable module 500.

In the shown example, a buffer circuit 560 forms an interface between link 204 and the input/output port of module 500. Buffer 560 may if need be enable to adapt the size of the data between link 204 and the input/output port of module 500.

In this example, arbitration circuit 309 is adapted to exchanging synchronization signals with data transfer circuit 203, as previously described. As an example, buffer 560 contains a data vector ready to be written into module 500. Logic circuit 305 sends a request for an elementary operation, here a writing, to the arbitration circuit. Arbitration circuit 309 allows, when possible, the writing of said data vector ready in register 560 by sending a control signal, of acknowledgement type, to logic circuit 305. Logic circuit 305 controls buffer circuit 303 to read said data vector from circuit BUF 303 and to write it into register 560. Arbitration circuit 309 then sends an instruction signal to the control circuit 530 of module 500, which controls the writing into module 500 of the data vector present in register 560. A similar inverse process may be provided in the case where it is desired to read a data vector from memory circuit 500 to transfer it into buffer circuit 303.

It should be noted that various buffer circuit control modes may be envisaged, particularly to perform rearrangement operations. The examples given in patents EP2476061, EP2320325, and FR1757998 filed by the applicant may for example be used as a model.

Further, in the above-mentioned examples, the arbitration circuit exchanges request and acknowledgement signals with logic circuit 305. Other alternative operations may be envisaged, by for example using request or acknowledgement registers, for example, present in the continuity of registers 301. Further, mechanisms of direct signal exchange between arbitration circuit 309 and buffer circuit 303 may be envisaged, particularly to synchronize the data transfer over link 204, and the writing of data into the addressee registers on the buffer circuit side, or on the side of memory circuit 500, particularly register 560.

Here again, an advantage of direct access circuit 203 is to allow direct data transfers from or to the array of elementary modules 510 of memory module 500, without blocking the access to the processor. Further, the presence of internal link 204 enables to avoid using a system bus to have the data transit between buffer circuit 303 and memory circuit 500. This internal link 204 thus is a direct link between direct transfer circuit 303 and the memory circuit, in that it does not use the data exchange resources shared with the other circuit elements. This direct internal link is in a way a "private" link between the memory circuit and the direct transfer circuit. This direct internal link 204 may in practice be formed by simple leads coupling two registers, a register on the memory circuit side and a register on the data transfer circuit side 203, for example, an input register of buffer circuit 303. This direct link may optionally comprise "buffer"-type elements to amplify or relay the signals transiting over the direct link. Further, the direct link may possibly include elements of logic gate type to enable to perform possible functions of synchronization or of resetting of the direct link, particularly close to the inputs/outputs of memory circuit 201, 500 or of direct transfer circuit 203.

Further, in the previous examples, data transfers between memory circuit 201 and an external memory circuit 253 have been described. According to an alternative embodiment, it is possible to provide instructions transmitted by the processor for direct transfer circuit 203 aiming at performing a data transfer between two locations of memory circuit 201, 500. In this case, the data read from memory circuit 201 temporarily transit through buffer circuit 303 before being written again into the memory circuit at another location. Such a transfer may further enable, by the way, to rearrange the data in an order, a different spatial organization, for example to ease the subsequent implementation of a computing operation on these data.

Various embodiments and variants have been described. Those skilled in the art will understand that certain features of these various embodiments and variants may be combined, and other variants will occur to those skilled in the art. In particular, the described embodiments are not limited to the examples of numerical values mentioned in the present disclosure.

Finally, the practical implementation of the described embodiments and variations is within the abilities of those skilled in the art based on the functional indications given hereabove. In particular, the forming of the different functional elements of the described systems is within the abilities of those skilled in the art based on the indications of the present description.

What is claimed is:

1. Memory device comprising:
   a port of connection of the device to a processor;
   a memory circuit adapted to implementing computing operations and to carrying out elementary operations including a reading, a writing, or a computing operation;
   a first control circuit adapted to receiving first instructions from the processor via said port, and of breaking down each first received instruction into a sequence of one or a plurality of elementary operations to generate a first elementary operation request flow;
   a circuit of direct data transfer from or to said memory circuit, the direct transfer circuit being adapted to receiving second instructions from the processor via said port, of breaking down each second received instruction into a sequence of a plurality of elementary operations to be performed in said memory circuit to generate a second elementary operation request flow;
   an internal data exchange link directly coupling said memory circuit to the direct transfer circuit; and
   an arbitration circuit adapted to receiving the first and second elementary operation request flows and of controlling the first control circuit to execute a single general elementary operation request flow in the memory circuit by implementing predefined priority rules in the case of simultaneous requests for access to the memory circuit,
   wherein the internal link has a data width greater than the data width of the port of connection of the device to the processor.

2. Memory device according to claim 1, wherein the direct transfer circuit comprises a buffer circuit adapted to temporarily storing data transiting from or to said memory circuit.

3. Memory device according to claim 1, comprising a distribution circuit) connected to said port of connection of the device to the processor, the distribution circuit receiving the first and second instructions from the processor and being adapted to transmitting the first instructions to the first control circuit and the second instructions to the direct transfer circuit, the distribution circuit using address information present in the instruction to perform this distribution.

4. Memory device according to claim 1, wherein the internal link has a data width equal to the size of the largest data vector capable of being read at once from said memory circuit.

5. Memory device according to claim 1, wherein the internal link has a data width at least twice greater than the data width of the port of connection of the device to the processor.

6. Memory device according to claim 1, wherein the direct transfer circuit is connected to a port of connection of the module to a memory system bus external to the device.

7. Memory device according to claim 6, wherein the port of connection of the device to the memory system bus has a data width greater than the data width of the port of connection of the device to the processor.

8. Memory device according to claim 2, wherein the direct transfer circuit is connected to a port of connection of the module to a memory system bus external to the device, and wherein the buffer circuit of the direct transfer circuit is adapted to temporarily storing data transiting between said memory circuit and an external memory circuit coupled to said memory system bus.

9. Memory device according to claim 1, wherein the direct transfer circuit comprises configuration registers storing the second instructions received from the processor.

10. Memory device according to claim 8, wherein the direct transfer circuit further comprises a second control circuit adapted to reading from and writing into the configuration registers, to exchanging control data with the arbitration circuit, and to controlling data transfers via the buffer circuit.

11. Memory device according to claim 1, wherein said memory circuit comprises a plurality of memory circuits adapted to implementing computing operations, said memory circuits being arranged in an array of rows and columns.

12. Memory device according to claim 11, wherein the array of memory circuits is reconfigurable to adjust the dimensions of the data vectors in the row direction.

13. System comprising the memory device of claim 1, a processor adapted to transmitting the first and second instructions to the memory device, a memory system bus coupled to the direct transfer circuit of the memory device, and an external memory circuit coupled to the memory system bus, wherein the direct transfer circuit is adapted to transferring data directly between the memory circuit of the device and the external memory circuit via the memory system bus, without transiting through the processor.

* * * * *